(12) United States Patent
Bolz

(10) Patent No.: US 8,143,954 B2
(45) Date of Patent: Mar. 27, 2012

(54) OSCILLATION DEVICE WITH AUXILIARY OSCILLATING MEANS

(75) Inventor: Stephan Bolz, Pfatter (DE)

(73) Assignee: Continental Automotive GmbH, Hannover (DE)

( * ) Notice: Subject to any disclaimer, the term of this patent is extended or adjusted under 35 U.S.C. 154(b) by 0 days.

(21) Appl. No.: 12/297,146

(22) PCT Filed: Jan. 16, 2008

(86) PCT No.: PCT/EP2008/050427
§ 371 (c)(1),
(2), (4) Date: Oct. 14, 2008

(87) PCT Pub. No.: WO2008/092742
PCT Pub. Date: Aug. 7, 2008

(65) Prior Publication Data
US 2010/0013564 A1 Jan. 21, 2010

(30) Foreign Application Priority Data
Jan. 31, 2007 (DE) .......................... 10 2007 004 817

(51) Int. Cl.
*H03L 7/00* (2006.01)
(52) U.S. Cl. .................. 331/2; 331/46; 331/55; 363/16; 363/49; 315/294
(58) Field of Classification Search .............. 331/2, 46, 331/55; 363/16, 49; 315/294
See application file for complete search history.

(56) References Cited

U.S. PATENT DOCUMENTS

| | | |
|---|---|---|
| 3,376,493 A | 4/1968 | Carlson |
| 3,376,495 A | 4/1968 | Leonard |
| 3,401,327 A | 9/1968 | Leppert |
| 3,469,211 A | 9/1969 | Shoh et al. |
| 4,617,620 A | 10/1986 | Speranza |
| 5,369,561 A | 11/1994 | McCullough |
| 5,534,826 A | 7/1996 | Logan |
| 5,825,138 A * | 10/1998 | Diazzi et al. .................. 315/294 |
| 6,154,375 A | 11/2000 | Majid et al. |
| 6,670,860 B2 | 12/2003 | Kobayashi et al. |

FOREIGN PATENT DOCUMENTS

| | | |
|---|---|---|
| EP | 0709965 A1 | 5/1996 |
| EP | 1179886 A2 | 2/2002 |
| WO | 9323916 A1 | 11/1993 |
| WO | 0128078 A1 | 4/2001 |

OTHER PUBLICATIONS

German Office Action dated Nov. 30, 2007.
International Search Report dated May 30, 2008.

* cited by examiner

*Primary Examiner* — Arnold Kinkead
(74) *Attorney, Agent, or Firm* — Laurence A. Greenberg; Werner H. Stemer; Ralph E. Locher

(57) ABSTRACT

A device can be coupled to an electrical load for supplying electrical power to the electrical load. The device contains an oscillator unit and an auxiliary oscillator unit. The oscillator unit is configured to generate an output signal of the device which can be supplied to the electrical load and which has a first frequency. The auxiliary oscillator unit is electrically coupled to the oscillator unit. The auxiliary oscillator unit is configured to excite the oscillator unit to oscillate at a second frequency greater than the first frequency. The auxiliary oscillator unit contains a timing element which is configured and arranged to terminate the excitation of the oscillator unit after the expiration of a pre-specified period of time after the start of the oscillator unit and the auxiliary oscillator unit.

7 Claims, 2 Drawing Sheets

OSCILLATION DEVICE WITH AUXILIARY OSCILLATING MEANS

BACKGROUND OF THE INVENTION

Field of the Invention

The invention relates to a device comprising an oscillator unit, which can be coupled to an electrical load for the purpose of supplying electrical energy to the electrical load.

The electrical energy is to be supplied to the electrical load in the form of an A.C. voltage having a predetermined frequency and a predetermined voltage amplitude. This A.C. voltage is generated by means of the oscillator unit. Depending on the electrical load, however, starting of the oscillator unit can be adversely affected.

BRIEF SUMMARY OF THE INVENTION

The invention addresses the problem of creating a device comprising an oscillator unit which starts reliably.

The problem is solved by means of the features in the independent patent claims. Advantageous developments of the invention are characterized in the subclaims.

The invention is characterized by a device which can be coupled to an electrical load for the purpose of supplying electrical energy to the electrical load. The device comprises an oscillator unit and an auxiliary oscillator unit. The oscillator unit is designed to generate an output signal of the device, wherein said output signal can be supplied to the electrical load and has a first frequency. The auxiliary oscillator unit is electrically coupled to the oscillator unit. Furthermore, the auxiliary oscillator unit is designed to stimulate the oscillator unit to oscillate, using a second frequency which is higher than the first frequency. The auxiliary oscillator unit includes a timing element which is designed and arranged for the purpose of terminating the stimulation of the oscillator unit after expiry of a predetermined time period following startup of the oscillator unit and the auxiliary oscillator unit.

The invention is based on the insight that the starting of the oscillator unit can be adversely affected if the electrical load has a load resistance which is too low. Open-loop gain of the oscillator unit can be reduced by the low load resistance to such an extent that reliable starting of the oscillator unit cannot be guaranteed. By means of the auxiliary oscillator unit, the oscillator unit can be started in a controlled and reliable manner by virtue of the oscillator unit being automatically synchronized with the auxiliary oscillator unit. After expiry of the predetermined time period, which lies in the region of e.g. approximately 100 microseconds or milliseconds, the oscillator unit can then oscillate at its own first frequency. Low-loss operation of the oscillator unit is therefore possible. Moreover, such a device is easy and inexpensive to implement. In particular, the oscillator unit is a power oscillator unit.

The invention is particularly suitable for transferring electrical energy to the electrical load in the form of the output signal, this being in particular a differential output signal in relation to a predetermined reference potential, for operating the electrical load, e.g. for operating a heating unit, in particular an inductive heating unit of a fuel injection valve in a motor vehicle. In particular, the device is a control device in the motor vehicle.

In an advantageous embodiment, the oscillator unit comprises at least one transistor which represents a loop amplifier for the generation of the output signal. The auxiliary oscillator unit is coupled to a control input of the at least one transistor for the purpose of triggering the at least one transistor. This has the advantage that the switching of the at least one transistor can therefore be controlled by the auxiliary oscillator unit in this way. The switching therefore takes place in a controlled manner and as predetermined by the auxiliary oscillator unit. Only low power is required for the triggering of the at least one transistor, and therefore the auxiliary oscillator unit can be inexpensive in its design. In particular, the at least one transistor is designed as a power transistor.

In this context, it is advantageous if two transistors are provided in the oscillator unit, each representing a loop amplifier for the generation of the output signal, and the auxiliary oscillator unit is designed to trigger the two transistors alternately. By virtue of the two transistors, it is possible in particular to generate the differential output signal which is essentially symmetrical to the predetermined reference potential. The advantage is that the two transistors are not simultaneously switched through. As a result, it is possible to prevent the occurrence of a current peak during the starting of the oscillator unit. Such a current peak represents a considerable load for the components of the oscillator unit and in particular for the at least one transistor, and can result in a reduced service life and reliability of the oscillator unit. By preventing the current peak, the reliability and service life of the oscillator unit are therefore preserved. Furthermore, the current peak can also result in nuisance electromagnetic radiation which must be suppressed by means of expensive filter measures if applicable. By preventing the occurrence of the current peak, however, such filter measures are not necessary. The device can therefore be particularly inexpensive in its design.

In a further advantageous embodiment, the oscillator unit and the auxiliary oscillator unit have a shared activation input. The oscillator unit is designed to activate or deactivate a supply of a bias voltage, which is required for the generation of the output voltage, to the control interface of the at least one transistor, depending on an activation signal at the activation input. Furthermore, the auxiliary oscillator unit is designed to start the timer depending on the activation signal. The advantage is that the activation and deactivation and the corresponding starting and stopping of the oscillator unit takes place via the relevant control input and the at least one transistor. The power required for activating and deactivating and starting and stopping is therefore particularly low. In this context, the device can therefore be constructed in a very simple manner using inexpensive components, e.g. small-signal components. Furthermore, it is therefore possible to integrate these components into a semiconductor component.

In a further advantageous embodiment, the auxiliary oscillator unit comprises a multivibrator or Schmitt trigger oscillator. This has the advantage that the auxiliary oscillator unit can have a very simple and inexpensive design while also allowing reliable stimulation of the oscillator unit.

Exemplary embodiments of the invention are explained below with reference to the schematic drawings, in which:

DESCRIPTION OF THE INVENTION

Elements having identical construction or function are given the same reference signs in all the figures.

Figure 1:
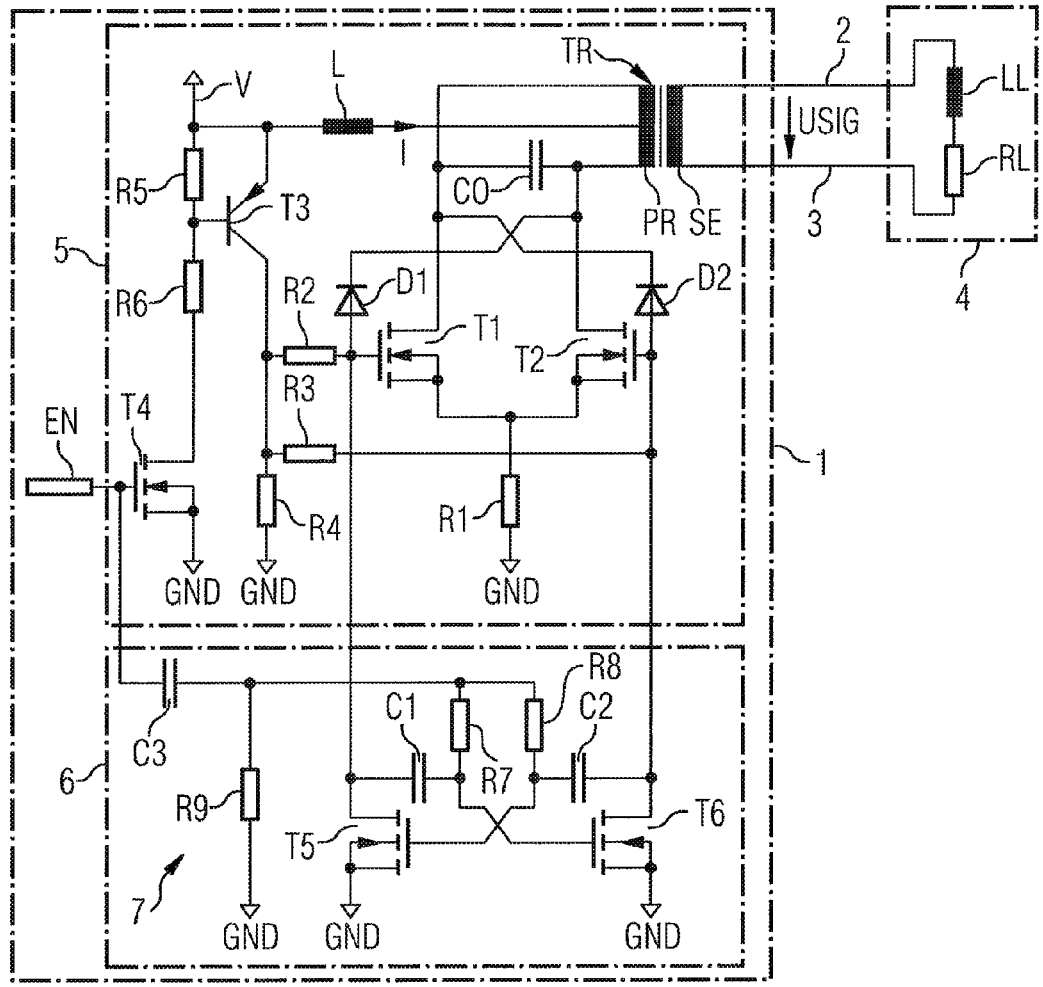
FIG. 1 shows a device comprising an oscillator unit and a first embodiment of an auxiliary oscillator unit.

A device 1 is coupled to an electrical load 4, i.e. to an electrical power absorber, via a first line 2 and a second line 3 (FIG. 1). The device 1 is e.g. a control unit in a motor vehicle, and the first and the second line 2, 3 are carried e.g. in a wiring loom of the motor vehicle.

The device 1 is designed to generate an output signal USIG which preferably takes the form of a sinusoidal alternating voltage having a high voltage amplitude and a first frequency. The device 1 is further designed to supply the output signal USIG to the load 4 via the first and the second line 2, 3. For example, the first frequency of the output signal USIG is between approximately 40 and 50 kHz and its voltage amplitude is approximately 140 V between maximum and minimum of the signal profile of the output signal USIG within a period of oscillation. For example, a power in a range of approximately 100 to 200 watts is transferred from the device 1 to the load 4 in this way. The load 4 is an inductively heatable fuel injection valve, for example. However, the first frequency of the output signal USIG, the voltage amplitude, and/or the transferred power can also be higher or lower. Moreover, the device 1 can also be operated in connection with another load 4.

The device 1 comprises an oscillator unit 5 for generating the output signal USIG and an auxiliary oscillator unit 6. The oscillator unit 5 is coupled to the first and the second line 2, 3. The oscillator unit 5 is preferably designed to generate the output signal USIG in such a way that this is essentially symmetrical relative to a predetermined reference potential GND. The signal is therefore transferred differentially. This is particularly beneficial with regard to electromagnetic radiation which, particularly in the case of high-frequency signals having a high voltage amplitude, can occur at nuisance levels and possibly disrupt other electrical components. In particular, the predetermined reference potential GND is a ground potential, e.g. the potential of a chassis of a motor vehicle. The oscillator unit 5 can also be designed differently, however.

The oscillator unit 5 preferably comprises a power oscillator or is designed as a power oscillator unit. The oscillator unit 5 comprises a first transistor T1 and a second transistor T2, which are preferably designed as power transistors. A respective source interface of the first and the second transistor T1, T2 is coupled to the predetermined reference potential GND via a first resistor R1. The first resistor R1 is provided e.g. in order to capture a current through the first or the second transistor T1, T2 with reference to a voltage drop across the first resistor R1. However, the respective source interface of the first and the second transistor T1, T2 can likewise be coupled directly to the predetermined reference potential GND. A respective drain interface of the first and the second transistor T1, T2 is coupled in each case to an interface of an oscillator capacitor CO.

The oscillator unit 5 is further designed such that a respective gate interface of the first and the second transistor T1, T2 is triggered alternately. The respective gate interface represents a respective control input of the first or the second transistor T1, T2. The control input of the first transistor T1 is coupled to the drain interface of the second transistor T2 via a first diode D1. Correspondingly, the control input of the second transistor T2 is coupled to the drain interface of the first transistor T1 via a second diode D2.

The oscillator unit 5 further comprises a transformer TR which has a primary winding PR and a secondary winding SE. The primary winding PR is arranged electrically in parallel with the oscillator capacitor CO. The primary winding features a center tap which is coupled to a predetermined supply potential V via a decoupling inductance L. A voltage between the predetermined supply potential V and the predetermined reference potential GND is approximately 12 volts, for example. However, this voltage can also be higher or lower than 12 volts. During operation of the oscillator unit 5, a current I flows through the decoupling inductance L.

The secondary winding SE is coupled to the first and the second line 2, 3. The load 4 comprises e.g. a load inductance LL and a load resistor RL which are arranged electrically in series. The load inductance LL and the load resistor RL form a circuit with the secondary winding SE and the first and the second line 2, 3.

The first frequency of the output signal USIG which can be transferred via the first and the second line 2, 3 is essentially predetermined by a capacitance value of the oscillator capacitor CO and by an inductance value, which is formed by the electrically parallel primary winding PR of the transformer TR and by the load inductance LL that is transformed by the transformer TR.

In order to be able to generate the output signal USIG, it is necessary to supply a bias voltage to the relevant control input of the first and the second transistor T1, T2, said bias voltage being higher than a threshold voltage of the first or the second transistor T1, T2 respectively. For this, the relevant control input is electrically coupled to a collector interface of the third transistor T3 via a second resistor R2 or a third resistor R3. The third transistor T3 is preferably designed in the form of a small-signal transistor. The third transistor T3 is coupled via its emitter interface to the predetermined supply potential V. Furthermore, the second and the third resistor R2, R3 and the collector interface of the third transistor T3 are coupled to the predetermined reference potential GND via a fourth resistor R4. The fourth resistor R4 ensures that the first and the second transistor T1, T2 are reliably switched off if the third transistor T3 is blocked.

A basic interface of the third transistor T3 is coupled to the predetermined supply potential V via a fifth resistor R5 and can be coupled to the predetermined reference potential GND via a sixth resistor R6 and a fourth transistor T4. For this, the fourth transistor T4 is arranged electrically between the sixth resistor R6 and the predetermined reference potential GND. A gate interface of the fourth transistor T4 is electrically coupled to an activation input EN of the oscillator unit 5. The fourth transistor T4 is preferably designed in the form of a small-signal transistor.

Depending on an activation signal which can be supplied to the activation input EN and is formed by a digital high level, for example, the fourth transistor T4 is switched on. As a result of this, the third transistor T3 is also switched on and therefore raises a potential at the relevant control input of the first and the second transistor T1, T2 in the direction of the predetermined supply potential V, such that the bias voltage can be applied between the control input of the first and the second transistor T1, T2 and the predetermined reference potential GND. The supply of the bias voltage can therefore be activated by the activation signal.

The first and the second transistor T1, T2 represent a loop amplifier of the oscillator unit 5 in each case, wherein said loop amplifier uses its respective loop gain to deattenuate an oscillatory circuit which is essentially formed by the oscillator capacitor CO and the electrically parallel primary winding PR and transformed load inductance LL. When the oscillator unit 5 oscillates at the first frequency, the first and the second transistors T1, T2 are alternately and reciprocally switched on and off due to the feedback via the first and the second diode. The resulting output signal USIG is essentially sinusoidal.

Furthermore, the supply of the bias voltage can also be deactivated depending on the activation signal, e.g. if this signal has a digital low level. The fourth transistor T4 and hence also the third transistor T3 are then blocked, and the relevant control input of the first and the second transistor T1, T2 goes to the predetermined reference potential GND via the fourth resistor R4 and via the second or the third resistor R2, R3. The first and the second transistor T1, T2 are then switched off and the output signal USIG is not generated.

The oscillator unit 5 might have insufficient starting performance, particularly if a resistance value of the load resistor RL is low. The loop gain of the oscillator unit 5 might then be insufficient to ensure reliable starting of the oscillator unit 5. This results in the risk that both the first and the second transistor T1, T2 are simultaneously switched on, at least for a short period of time, and therefore the current I through the decoupling inductance L, the primary winding PR and the first and the second transistor T1, T2 becomes very high, i.e. a current peak is generated. Such a current peak can be e.g. higher than 50 amperes in the case of a current I of approximately 10 to 16 amperes which is provided for the operation of the oscillator unit 5. This can significantly reduce the service life and reliability of the oscillator unit 5. Furthermore, electromagnetic radiation can be unacceptably increased by the current peak, such that provision must be made for expensive filter mechanisms if applicable, in order to comply with possible limit values in relation to the electromagnetic compatibility (EMC).

In order to prevent the current peaks and the associated adverse effects, and in order to ensure reliable and smooth starting of the oscillator unit 5, the device 1 comprises the auxiliary oscillator unit 6 which is coupled to the oscillator unit 5. A first embodiment of the auxiliary oscillator unit 6 is designed in the form of an astable latch. The astable latch can also be designated as a multivibrator. This comprises a fifth transistor T5 and a sixth transistor T6. The fifth and the sixth transistor T5, T6 are preferably designed in the form of small-signal transistors.

A relevant source interface of the fifth and the sixth transistor T5, T6 is coupled to the predetermined reference potential GND. A drain interface of the fifth transistor T5 is coupled to the control input of the first transistor T1 and a drain interface of the sixth transistor T6 is coupled to the control input of the second transistor T2. The drain interface of the fifth transistor T5 is also coupled to a gate interface of the sixth transistor T6 via a first capacitor C1. The drain interface of the sixth transistor T6 is correspondingly coupled to a gate interface of the fifth transistor T5 via a second capacitor C2. The multivibrator also comprises a seventh and an eighth resistor R7, R8 which are respectively coupled to the gate interface of the sixth transistor T6 and to the gate interface of the fifth transistor T5. The second and the third resistor R2, R3 of the oscillator unit 5 form a load resistance of the multivibrator in each case.

The auxiliary oscillator unit 6 also features a timer 7 which comprises a third capacitor C3 and a ninth resistor R9, these being coupled in each case to the seventh and the eighth resistor R7, R8. The relevant gate interface of the fifth and the sixth transistor T5, T6 is coupled to the activation input EN via the seventh or the eighth resistor R7, R8 respectively and via the third capacitor C3. In addition, the relevant gate interface of the fifth and the sixth transistor T5, T6 is coupled to the predetermined reference potential GND via the seventh and the eighth resistor R7, R8 respectively and via the ninth resistor R9.

If the activation signal at the activation input EN jumps from the low level to the high level, for example, the fifth and the sixth transistor T5, T6 then receive a voltage supplied to their respective gate interface, which voltage allows operation of the auxiliary oscillator unit 6 and in particular the multivibrator for a predetermined time period. In addition, if the bias voltage of the first and the second transistor T1, T2 is activated, the relevant drain interface of the fifth and the sixth transistor T5, T6 is coupled to the predetermined supply potential V via the second or the third resistor R2, R3 respectively and the third transistor T3, such that the multivibrator can start. The predetermined time period is essentially dependent on a capacitance value of the third capacitor C3 and a resistance value of the resistor R9. The predetermined time period is e.g. approximately 100 microseconds. However, the predetermined time period can also be longer or shorter than 100 microseconds.

The auxiliary oscillator unit 6 and in particular the multivibrator oscillates at a second frequency which is essentially predetermined by a relevant capacitance value of the first and the second capacitor C1, C2 and by a relevant resistance value of the seventh and eighth resistor R7, R8. The second frequency is selected such that it is higher than the first frequency. For example, the first frequency is between approximately 40 and 50 kHz and the second frequency is approximately 60 kHz. However, the first and/or the second frequency can also be higher or lower.

The multivibrator is designed to switch the fifth and the sixth transistor T5, T6 on and off alternately and reciprocally, such that only one of the two transistors is generally switched on at any time. By virtue of the coupling of the fifth transistor T5 to the control input of the first transistor T1, and the coupling of the sixth transistor T6 to the control input of the second transistor T2, the first and the second transistor T1, T2 and hence the oscillator unit 5 are automatically controlled by the auxiliary oscillator unit 6. The relevant control inputs of the first and the second transistor T1, T2 are alternately drawn to the predetermined reference potential GND by the fifth and the sixth transistor T5, T6 respectively, such that the relevant transistor switches off. In addition, as a result of the second frequency being higher than the first frequency, the oscillator unit 5 is automatically synchronized with the auxiliary oscillator unit 6. This ensures that only either the first or the second transistor T1, T2 is generally switched on. The occurrence of the current peak is thereby reliably prevented.

The voltage at the relevant gate interface of the fifth and the sixth transistor T5, T6 is fed back to the predetermined reference potential GND via the seventh or eighth resistor R7, R8 respectively and the ninth resistor R9, and the fifth and the sixth transistors T5, T6 are thus reliably blocked. If the fifth and the sixth transistors T5, T6 are blocked, the oscillation of the oscillator unit 5 and the generation of the output signal USIG take place at the first frequency and are essentially unaffected by the auxiliary oscillator unit 6. Particularly low-loss generation of the output signal USIG is therefore possible.

Figure 2:
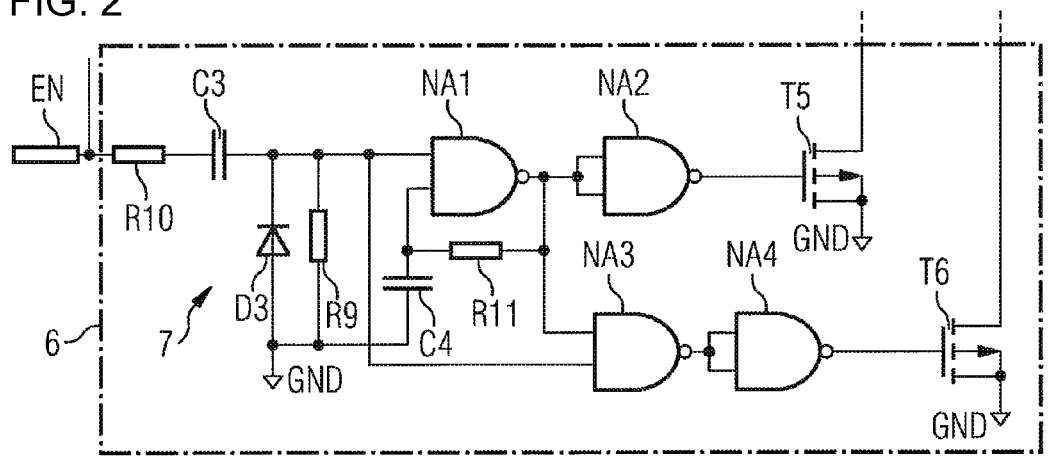
FIG. 2 shows a second embodiment of the auxiliary oscillator unit.

FIG. 2 shows an alternative, second embodiment of the auxiliary oscillator unit 6, which is designed in the form of a Schmitt trigger oscillator. The Schmitt trigger oscillator can be implemented very easily by means of logic gates, for example.

The activation input EN is electrically coupled to a first input of a first gate NA1 via a tenth resistor R10 and via the third capacitor C3. The first gate NA1 is designed in the form of a NAND gate, for example. This first input of the first gate NA1 is also coupled to the predetermined reference potential GND via the ninth resistor R9 and a third diode D3, these being arranged in parallel with each other. A second input of the first gate NA1 is coupled to the predetermined reference potential GND via a fourth capacitor C4, and also to an output of the first gate NA1 via an eleventh resistor R11. The first gate NA1, the eleventh resistor R11 and the fourth capacitor C4 form a Schmitt trigger. The output of the first gate NA1 is coupled to the gate interface of the fifth transistor T5 via a second gate NA2. The second gate NA2 is an inverter, for example, but can also be provided by a correspondingly configured NAND gate.

A third gate NA3 having the form of e.g. a NAND gate and a fourth gate NA4 having the form of e.g. an inverter or a correspondingly configured NAND gate are provided for triggering the sixth transistor T6. A first input of the third gate NA3 is coupled to the output of the first gate NA1. A second input of the third gate NA3 is coupled to the first input of the first gate NA1. An output of the third gate NA3 is coupled to the gate interface of the sixth transistor T6 via the fourth gate NA4.

Figure 3:
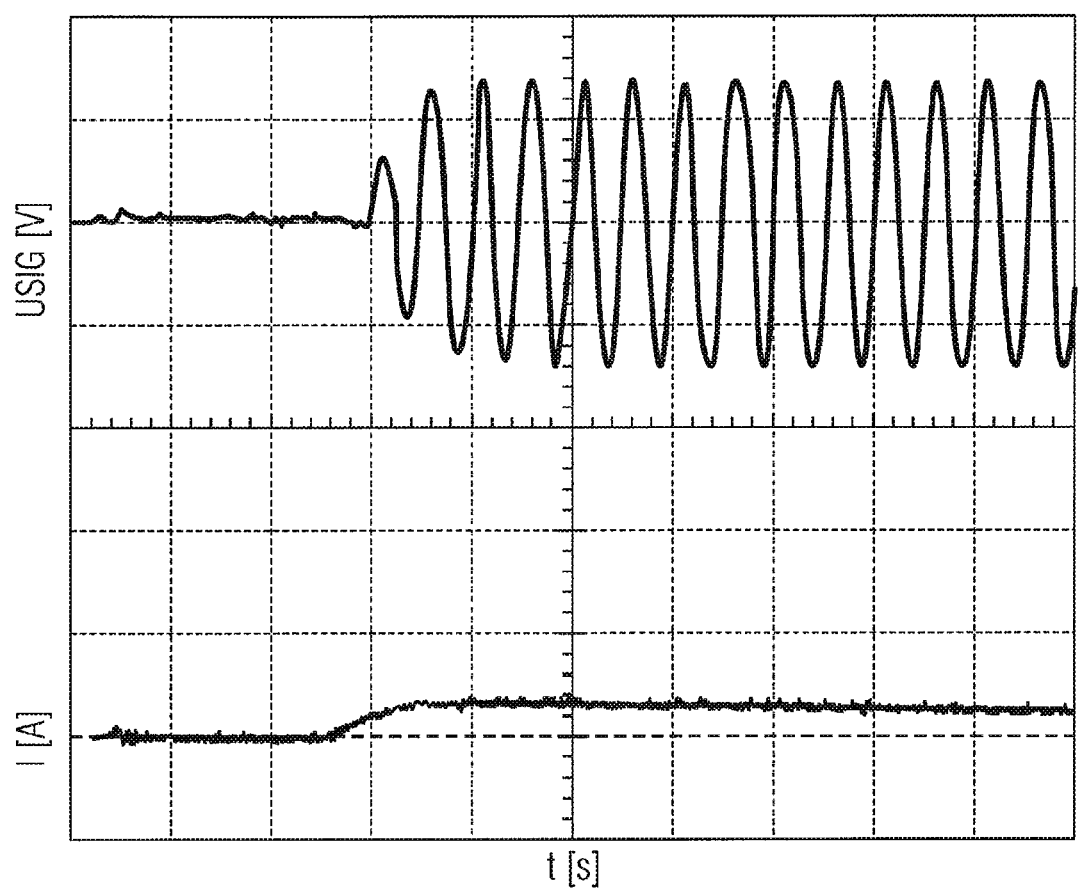
FIG. 3 shows a voltage/time diagram and a current/time diagram.

FIG. 3 shows a voltage/time diagram comprising a signal profile of the output signal USIG after the oscillator unit 5 and the auxiliary oscillator unit 6 have been started by the activation signal. FIG. 3 also shows a current/time diagram comprising an associated profile of the current I. The current peak is completely suppressed and the oscillator unit oscillates steadily, reliably and smoothly.

The oscillator unit 5 and/or the auxiliary oscillator unit 6 can also be designed differently. In the oscillator unit 5, for example, it is also possible to provide for only one transistor which represents a loop amplifier of the oscillator unit for the generation of the output signal USIG, particularly if the output signal USIG is not generated differentially. The auxiliary oscillator unit has to automatically control only this one transistor accordingly.

The invention claimed is:

1. A device to be coupled to an electrical load for supplying electrical energy to the electrical load, the device comprising:
   an oscillator unit for generating an output signal supplied to the electrical load and having a first frequency; and
   an auxiliary oscillator unit electrically coupled to said oscillator unit and configured to stimulate said oscillator unit to oscillate, using a second frequency being higher than the first frequency;
   said auxiliary oscillator having a timing element that enables said auxiliary oscillator to oscillate for only a predetermined time period following startup of said oscillator unit and said auxiliary oscillator unit;
   said auxiliary oscillator unit terminating the stimulation of said oscillator unit after expiry of the predetermined time period.

2. The device according to claim 1, wherein:
   said oscillator unit contains at least one transistor representing a loop amplifier for generating the output signal and has a control input; and
   said auxiliary oscillator unit is coupled to said control input of said at least one transistor for triggering said at least one transistor.

3. The device according to claim 2, wherein said oscillator unit has two transistors, each representing a loop amplifier for generation of the output signal, and said auxiliary oscillator unit is configured to trigger said two transistors alternately.

4. The device according to claim 2, wherein:
   said oscillator unit and said auxiliary oscillator unit have a shared activation input;
   said at least one transistor has a control interface;
   said oscillator unit activates and deactivates a supply of a bias voltage, which is required for generating the output signal being an output voltage, to said control interface of said at least one transistor, depending on an activation signal at said activation input; and
   said auxiliary oscillator unit starts said timing element in dependence on the activation signal.

5. The device according to claim 1, wherein said auxiliary oscillator unit contains one of a multivibrator and a Schmitt trigger oscillator.

6. The device according to claim 1, wherein said auxiliary oscillator unit causes said oscillator unit to oscillate at said second frequency.

7. The device according to claim 1, wherein said auxiliary oscillator unit oscillates at said second frequency and supplies an output signal oscillating at said second frequency to said oscillator unit.

* * * * *